Nov. 12, 1957 M. A. McCOY 2,813,156
VARIABLE GAIN AMPLIFIER
Filed Nov. 30, 1953
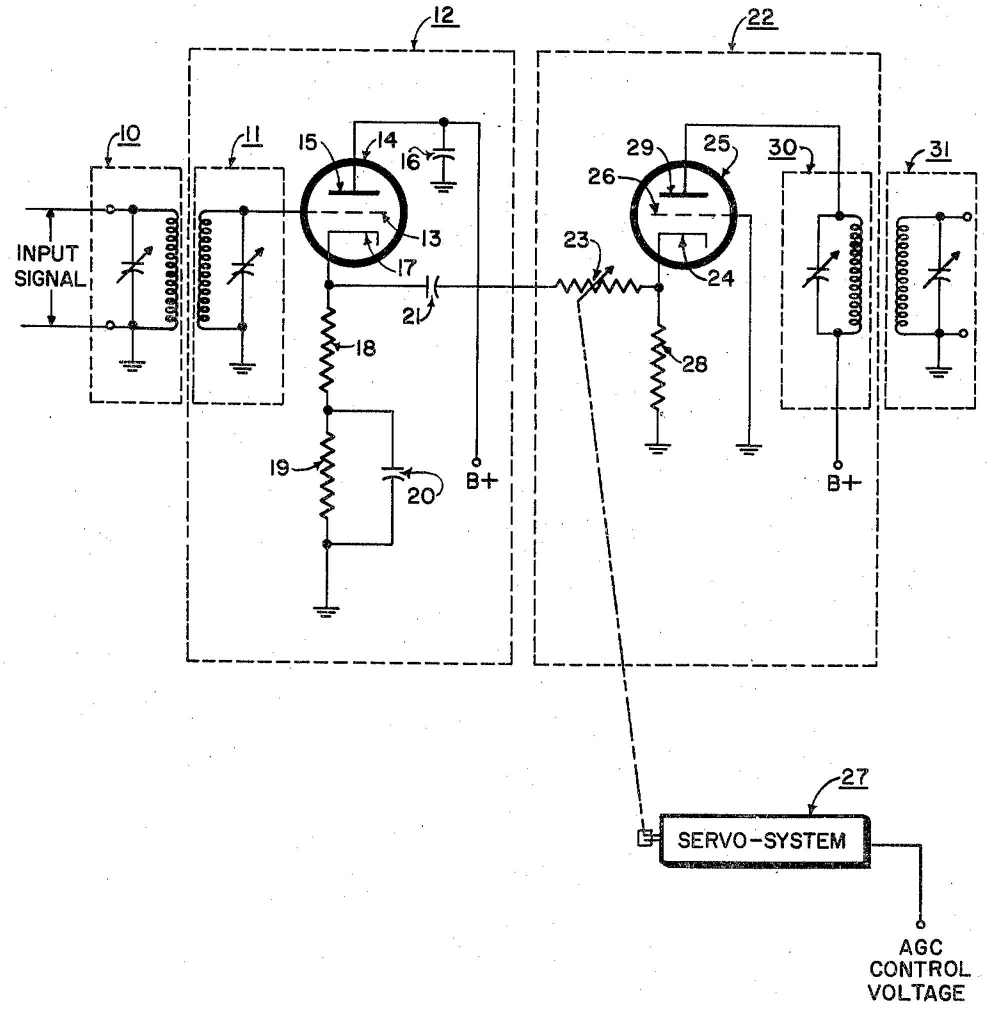
MARCUS A. McCOY
*INVENTOR.*
BY [signature]
HIS ATTORNEY United States Patent Office 2,813,156
Patented Nov. 12, 1957

2,813,156

VARIABLE GAIN AMPLIFIER

Marcus A. McCoy, Los Angeles, Calif., assignor to Hoffman Electronics Corporation, a corporation of California Application November 30, 1953, Serial No. 395,142

3 Claims. (Cl. 179—171)

This invention relates to signal level reduction circuits, and more particularly to such circuits which attenuate high frequency intelligence-bearing signals to a desired level, and which at the same time preserve fidelity, selectivity, and reduce cross-modulation.

In the past many methods have been employed to attenuate high frequency signals. Invariably, certain problems are encountered which render such methods deficient in some respect. For example, methods of employing a potentiometer in the grid circuit of a tuned amplifier stage to produce signal attenuation reduce selectivity by "de-Q'ing" the input tuned circuit. Methods which introduce bias on the grids of the radio frequency and intermediate frequency amplifiers to reduce gain encounter, under the influence of high degrees of attenuation, modulation distortion on signal peaks and intermodulation of strong signals.

Therefore, it is an object of this invention to provide an improved circuit for attenuating wave-signals.

It is a further object of this invention to provide an improved circuit for attenuating information-bearing wave-signals which will insure high fidelity reproduction and optimum selectivity of such information-bearing signals.

According to this invention, cathode-follower stage is cathode-coupled to a subsequent amplifier stage having a variable voltage divider network in its input circuit to provide variable attenuation of input signals without deleterious effects on selectivity of the associated circuitry.

The features of the present invention which are believed to be novel are set forth with particularity in the appended claims. The present invention itself, both as to its organization and manner of operation, together with further objects and advantages thereof, may best be understood by reference to the following description, taken in connection with the accompanying drawing, in which:

The sole figure is a schematic diagram of a high frequency attenuator circuit according to this invention.

In the figure, the incoming signal developed across tuned circuit 10 is coupled to tuned circuit 11 of cathode follower stage 12. Tuned circuit 11 is connected between control grid 13 of vacuum tube 14 and ground. Anode 15 is connected to a source of positive voltage, and through filter capacitor 16 to ground. Cathode 17 is connected through cathode load resistor 18, and through the biasing combination of resistor 19 and capacitor 20 to ground. The output signal across resistor 18 is coupled through capacitor 21 to the input circuit of amplifier stage 22. This input circuit consists of attenuating rheostat 23 connected to cathode 24 of vacuum tube 25. Cathode-coupling is used in preference to grid-coupling because resistance values which permit proper circuit functioning are proper for cathode coupling. Attenuating rheostat 23 may be either manually controlled by the operator or automatically controlled through servo-system 27 by an automatic gain control voltage. Cathode 24 is connected through resistor 28 to ground.

Control grid 26 is connected directly to ground. Anode 29 is connected through output tuned circuit 30 to a source of positive voltage (B+). The output signal developed across tuned circuit 30 is coupled to tuned circuit 31 of a subsequent stage.

The circuit just described operates as follows:

Input signals from tuned circuit 10 are coupled to tuned circuit 11 of cathode follower stage 12. According to techniques generally known in the art, the magnitude of the signal which may be delivered by the cathode of a cathode follower to the cathode load impedance is proportional to the magnitude of the load impedance. Thus, the maximum signal which vacuum tube 14 can deliver to vacuum tube 25 is determined by the impedance of the combination of resistors 18, 19, 23, and 28, and capacitors 20 and 21 in shunt with the effective resistance of vacuum tube 25. The values of resistors 18 and 19 and capacitor 20 are chosen to assure a gain in stage 12 of nearly unity, if the effects of loading by the coupling circuit including capacitor 21 and resistor 23 and 28 are ignored. The maximum value of variable resistor 23 is much greater than the resistance of resistor 18, so that with resistor 23 set at its maximum value, substantially no loading of resistor 18 occurs and the gain of stage 12 remains at its maximum value which is very nearly unity.

However, upon reducing the value of resistor 23 towards zero, the shunting action of resistor 28 and vacuum tube 25 upon cathode load resistor 18 becomes significant, and the effective load resistance for cathode 17 is reduced, thus reducing the gain of stage 12 to a factor in the order of .70. Hence, under this condition vacuum tube 14 can deliver at its cathode without overload a voltage only 70%, approximately, of the voltage it can deliver when resistor 23 is set at its maximum value.

Further, when resistor 23 is adjusted to its maximum value, signals of large magnitude may be applied to grid 13 of vacuum tube 14 without overloading it. Damping and loss of selectivity in input tuned circuits 10 and 11 are thus prevented. Simultaneously, the voltage drop across resistor 23 will be large with respect to that across resistor 28, and the signals will be greatly attenuated by this voltage divider action before being applied to cathode 28 of vacuum tube 25.

Conversely, when the input signals are weak, resistor 28 is set to a low value. The signal amplitude required to overload grid 13 is reduced, but the transfer of voltage to cathode 24 is greatly improved and the effective attenuation of the overall circuit is reduced.

By keeping the attenuator out of direct connection with the tuned circuits, adverse effects upon tuned circuit performance arising from attenuator adjustment are minimized.

The adjustment of resistor 23 may be made automatic where the signal amplitude variations are of relatively low frequency by using a servo-system interconnected with the automatic gain control system of the receiver.

While particular embodiments of the present invention have been shown and described, it will be obvious to those skilled in the art that changes and modifications may be made without departing from this invention in its broader aspects and, therefore, the aim in the appended claims is to cover all such changes and modifications as fall within the true spirit and scope of this invention.

I claim:

1. A wave-signal attenuating circuit including a first vacuum tube having anode, cathode, and control electrodes, means for applying wave signals to said control electrode, a first load resistor in the circuit of said cathode, a second vacuum tube having anode, cathode, and control electrodes, a second load resistor in the cathode circuit of said second vacuum tube, a coupling circuit including a series connected D. C. blocking condenser and variable resistor, the free terminal of said condenser being connected to the cathode-connected terminal of said first load resistor, the free terminal of said variable resistor being connected to the cathode-connected terminal of said second load resistor.

2. In a radio receiver having means for developing an AGC voltage, a variable gain amplifier including, in combination: a cathode follower stage followed by an amplifier stage, a network coupling the cathodes of said stages, said network including a D. C. blocking capacitor and a variable resistor, and servo means mechanically coupled to said variable resistor for varying the resistance thereof and electrically coupled to said AGC voltage means and responsive to the voltage therefrom.

3. In a radio receiver having means for developing an AGC voltage, the apparatus of claim 1 having servo means mechanically coupled to said variable resistor for varying the resistance thereof and electrically coupled to said AGC voltage means and responsive to the voltage therefrom.

References Cited in the file of this patent

UNITED STATES PATENTS

| | | |
|---|---|---|
| 1,811,954 | Mitchell | June 30, 1931 |
| 2,077,126 | O'Brien | Apr. 13, 1937 |
| 2,153,756 | Hunt | Apr. 11, 1939 |
| 2,200,055 | Burnett | May 7, 1940 |
| 2,246,331 | White | June 17, 1941 |
| 2,271,876 | Seeley | Feb. 3, 1942 |
| 2,276,565 | Crosby | Mar. 17, 1942 |
| 2,441,334 | Sayer | May 11, 1948 |
| 2,443,864 | MacAuley | June 22, 1948 |
| 2,586,803 | Fleming | Feb. 26, 1952 |

FOREIGN PATENTS

| | | |
|---|---|---|
| 526,499 | Great Britain | Sept. 19, 1940 |